US010686439B2

(12) United States Patent
Dubois et al.

(10) Patent No.: US 10,686,439 B2
(45) Date of Patent: Jun. 16, 2020

(54) PARALLEL SWITCH CURRENT CONTROL

(71) Applicant: Hamilton Sundstrand Corporation, Charlotte, NC (US)

(72) Inventors: Fabien Dubois, Aylesbury (GB); Karthik Debbadi, Cork (IE)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/192,949

(22) Filed: Nov. 16, 2018

(65) Prior Publication Data
US 2019/0229722 A1 Jul. 25, 2019

(30) Foreign Application Priority Data
Jan. 19, 2018 (IN) .............................. 201811002318

(51) Int. Cl.
H02M 1/088 (2006.01)
H03K 17/284 (2006.01)
H02M 1/08 (2006.01)
H01L 29/78 (2006.01)

(52) U.S. Cl.
CPC ............ *H03K 17/284* (2013.01); *H02M 1/08* (2013.01); *H02M 1/088* (2013.01); *H01L 29/7802* (2013.01)

(58) Field of Classification Search
CPC ...... H02M 1/088; H03K 17/28; H03K 17/284
USPC ....... 327/108, 109, 378, 392, 393, 394, 396, 327/399, 401, 403, 404, 405, 520
See application file for complete search history.

(56) References Cited

U.S. PATENT DOCUMENTS

| 5,051,603 | A | * | 9/1991 | Walker | H02M 1/088 307/20 |
| 5,889,663 | A | * | 3/1999 | Tabata | H02M 3/1584 363/56.03 |
| 9,762,114 | B2 | | 9/2017 | Lyle et al. | |
| 9,800,132 | B2 | * | 10/2017 | Szczesny | H02M 1/088 |
| 9,804,613 | B2 | * | 10/2017 | Gao | G05F 1/462 |
| 2004/0056646 | A1 | * | 3/2004 | Thalheim | H03K 17/10 323/364 |
| 2012/0043994 | A1 | * | 2/2012 | Alvarez Valenzuela | H03K 17/042 327/82 |
| 2012/0098577 | A1 | * | 4/2012 | Lobsiger | H02M 1/088 327/109 |
| 2014/0347103 | A1 | * | 11/2014 | Snook | H03K 17/0828 327/109 |
| 2015/0162902 | A1 | * | 6/2015 | Lizama | H03K 17/082 327/376 |
| 2016/0126822 | A1 | * | 5/2016 | Lyle | H02M 1/088 363/123 |
| 2019/0222210 | A1 | * | 7/2019 | Oinonen | H02M 1/088 |

FOREIGN PATENT DOCUMENTS

JP 2014230307 A 12/2014

* cited by examiner

Primary Examiner — William Hernandez
(74) Attorney, Agent, or Firm — Cantor Colburn LLP

(57) ABSTRACT

A method of controlling a power converter having a plurality of parallel-connected switching devices, the method comprising: measuring a threshold voltage of each of the parallel switching devices at start up of the parallel power converter in an initial self-calibration process; and determining synchronization of a time at which the threshold voltages of the respective switching devices occur.

8 Claims, 6 Drawing Sheets

PARALLEL SWITCH CURRENT CONTROL

FOREIGN PRIORITY

This application claims priority to Indian Patent Application No. 201811002318 filed Jan. 19, 2018, the entire contents of which is incorporated herein by reference.

TECHNICAL FIELD

The present disclosure is concerned with controlling the switch on of power converters or power switches comprising paralleled switching devices to avoid or minimise current imbalances.

BACKGROUND

Power converters find use in many fields for switching power to drive loads. Power converters may comprise networks of parallel and/or series connected power switching devices, particularly semiconductor switching devices such as IGBTs, FETs, MOSFETS and the like the switching of which is controlled by a gate drive.

Particularly for high power, high current applications, power switching devices are connected in parallel. This allows power losses to be distributed between several devices as well as to achieve high power within the size limitations of such switching devices. Distributing losses between several devices means that there is a lower risk of overheating at the device junction, thus improving the life of the switching devices.

A problem that has been identified with using paralleled switching devices is that if the devices are not identical (in almost all cases the devices will not be identical due to e.g. manufacturing and material tolerances), the current passing through the respective devices will also not be identical i.e. there may be a current imbalance. This may cause damage to the devices e.g. due to overheating. Even if the devices are nominally equivalent, there may very well be minor differences due to manufacturing tolerances, differences in physical dimensions, age, carrier concentration, materials etc. Alternatively, current imbalances can arise due to different device junction temperatures or gate drive imbalances. Damage can cause a switch to operate outside of its safe operating area.

Conventionally, this has been compensated by measuring the currents through the respective switching devices and compensate for the differences.

To compensate for such differences, it has been known to couple a passive component such as an inductor in series with the switching devices to reduce the imbalance in current sharing during transient—i.e. on switching on/power up and also adding in active control devices to counteract imbalances during steady state operation. If the switching devices are MOSFETs, these will also provide some self-balancing of current variation due to their positive temperature coefficient. Adding series inductance impedance in the power path, however, brings its own problems in that it slows down the switching and can generate a ringing effect with the parasitic element of the switching device. This adversely affects the EMI of the power converter.

It is desired to provide a power converter paralleled switching devices control method and arrangement which overcomes these problems, is non-intrusive, allows lower EMI and provides better control of current imbalance particularly during switching on, but without the need for a complex current system approach.

SUMMARY

In one aspect, the present disclosure provides a method of controlling a power converter having a plurality of parallel-connected switching devices, the method comprising: measuring a threshold voltage of each of the parallel switching devices at start up of the parallel power converter in an initial self-calibration process; and determining synchronization of a time at which the threshold voltages of the respective switching devices occur.

In another aspect, there is provided a system for controlling a power converter having a plurality of parallel-connected switching devices, the system comprising: means for measuring a threshold voltage of each of the parallel switching devices at start up of the parallel power converter in an initial self-calibration process; and means for determining synchronization of a time at which the threshold voltages of the respective switching devices occur.

PREFERRED FEATURES

Preferred embodiments will now be described, by way of example only, with reference to the accompanying drawings.

DETAILED DESCRIPTION

Figure 1A:
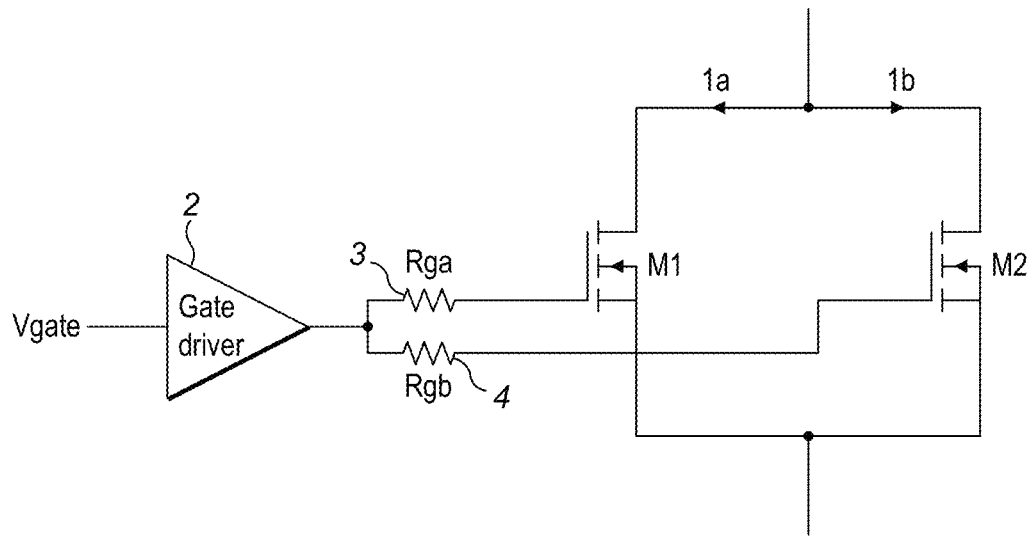
FIG. 1A is a schematic circuit diagram of a power switching circuit as known in the prior art.

A conventional, parallel-connected switching arrangement as described above is shown in FIG. 1A. Here, two MOSFETS M1, M2 are connected in parallel to the output of a gate driver 2 to which control voltage $v_{gate}$ is applied. Other arrangements may use different switching devices such as devices using FET technology, IGBTs etc. and more than two may be provided. The switching device outputs are provided to drive a connected load (not shown). The load current is shared between the two MOSFETS M1 and M2 (Ia, Ib). As mentioned above, in an ideal situation, Ia and Ib would be equal. In many cases, however, this is not the case, for a number of reasons. Gate resistors 3,4 may be connected in series with the MOSFET gates to compensate, to some extent, current imbalance, but, as mentioned in the background, problems still exits.

Figure 1B:
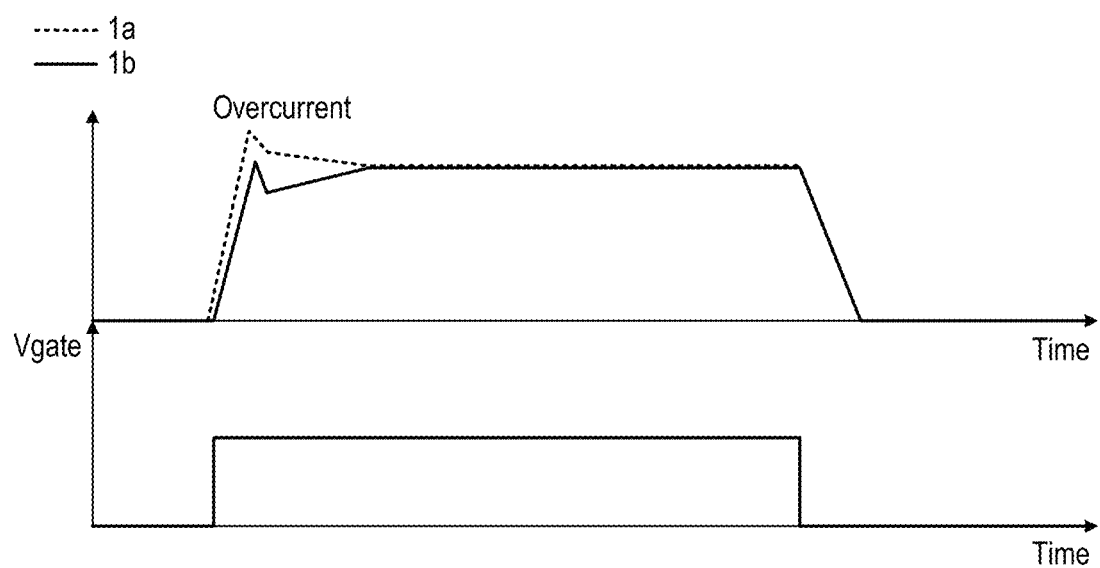
FIG. 1B shows the variation of current through the respective switching devices over time for the arrangement of FIG. 1A.

The current imbalance, particular in the transient state on switching on, can be seen in FIG. 1B. When the gate voltage Vgate is applied (at the time the Vgate line rises vertically in the lower part of the graph) current starts to flow through each of the switching devices M1 and M2 when their respective threshold voltage is crossed. Because, however, the devices are not identical, Ia and Ib will also not be identical, as can be seen in the top part of the graph. When the switches reach steady state, Ia and Ib will approach each other. The problem of current imbalance is, therefore, mainly at switch on and switch off.

Figure 3:
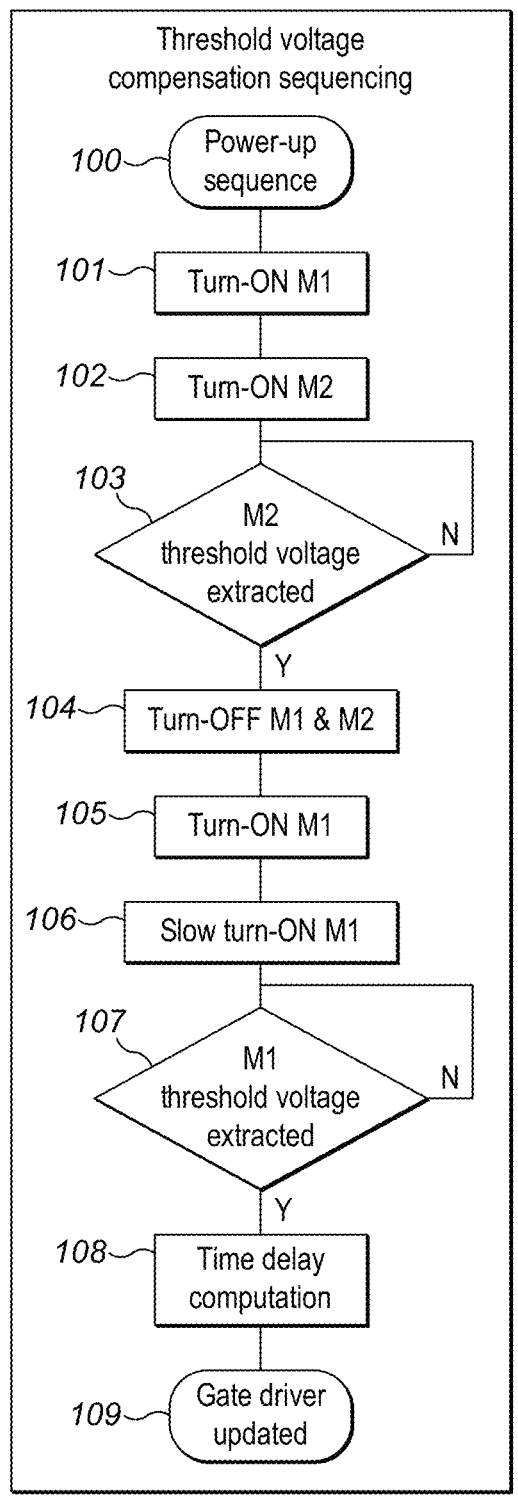
FIG. 3 is a flow chart showing the sequence of threshold voltage compensation for an arrangement such as shown in FIG. 1C.

The aim of this disclosure is to reduce the difference between currents Ia and Ib, particularly in the transient stage of switch on and switch off. To do this, the present disclosure provides a method and apparatus to measure the threshold voltage of each of the parallel switching devices at the start up/switch on of the power converter, to compute a time delay between the gate signals of the respective switching devices, in an initial self-calibration process, and to apply this time delay during normal operation of the converter. The threshold voltage is derived from the gate current during a specific power up sequence such as shown in FIG. 3 and described further below.

Figure 2:
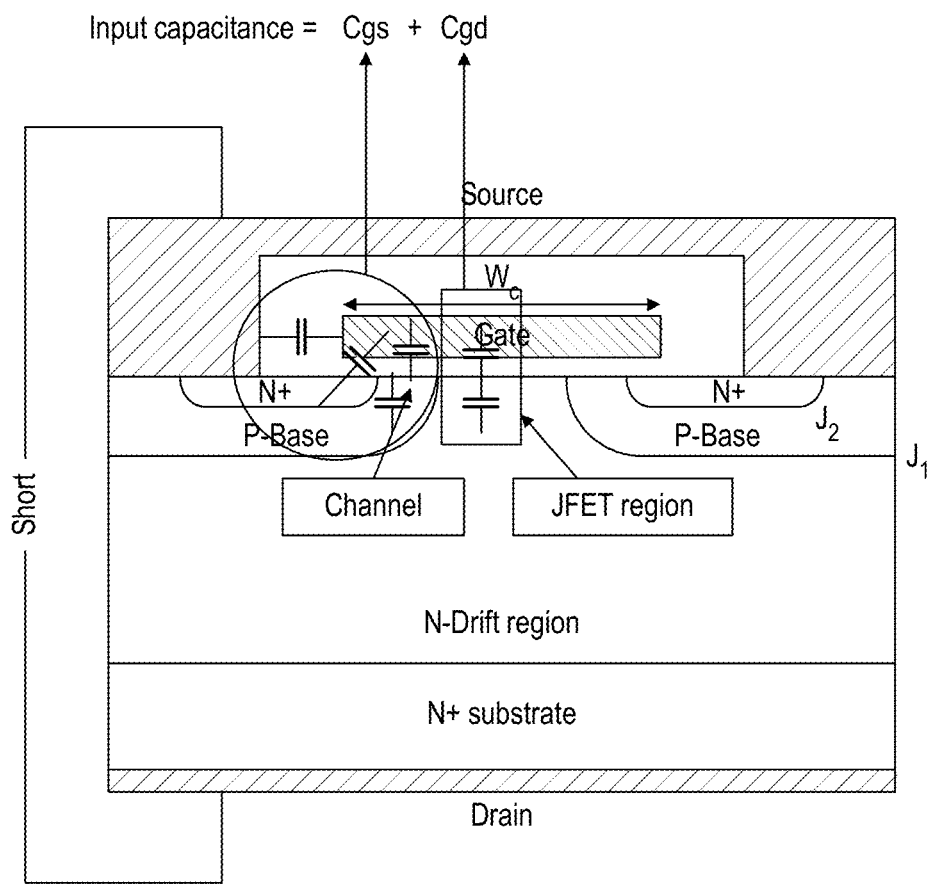
FIG. 2 illustrates the variation in input capacitance with gate-to-source voltage for a D-MOSFET.
Figure 2:
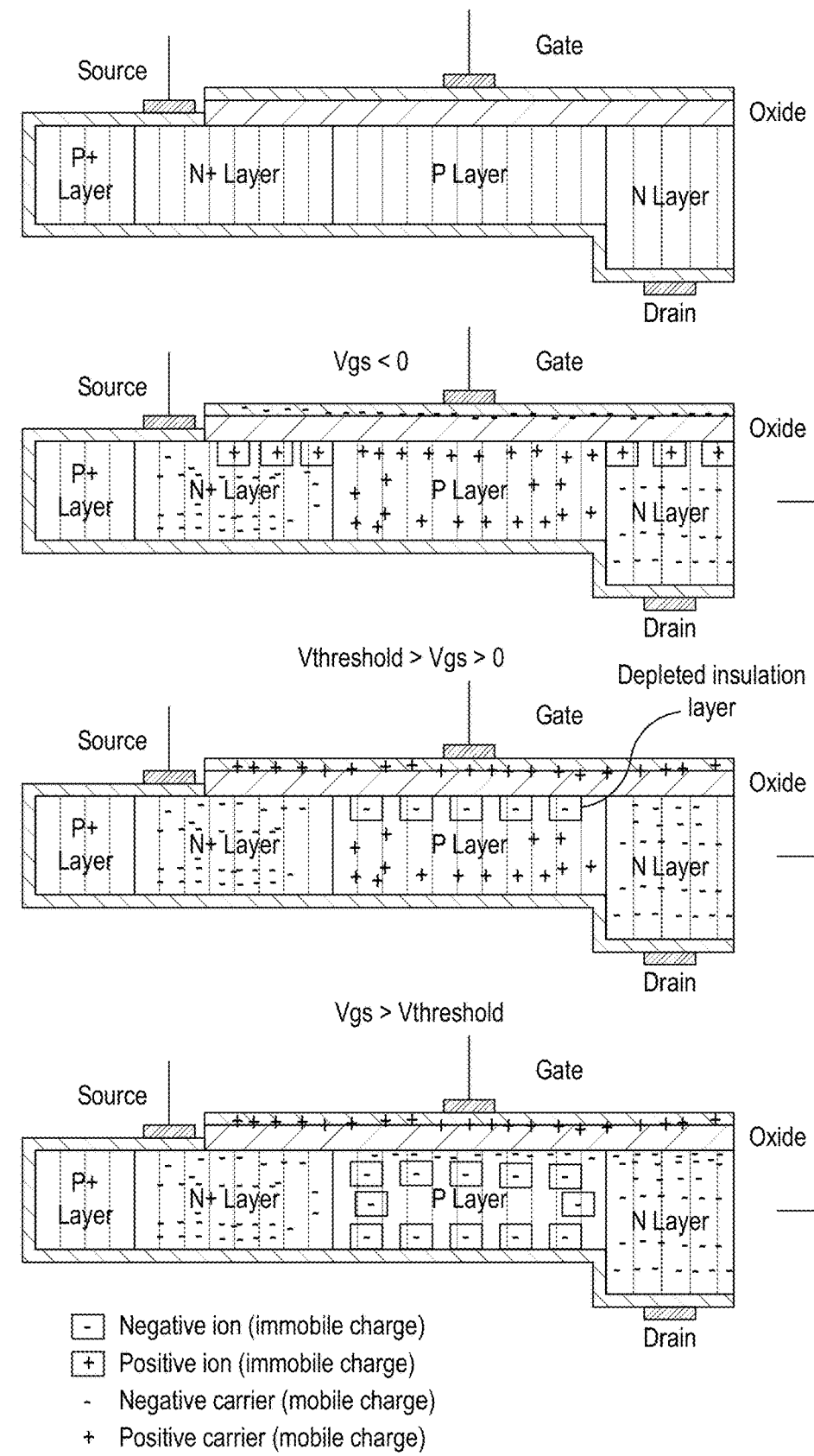
Figure 2:
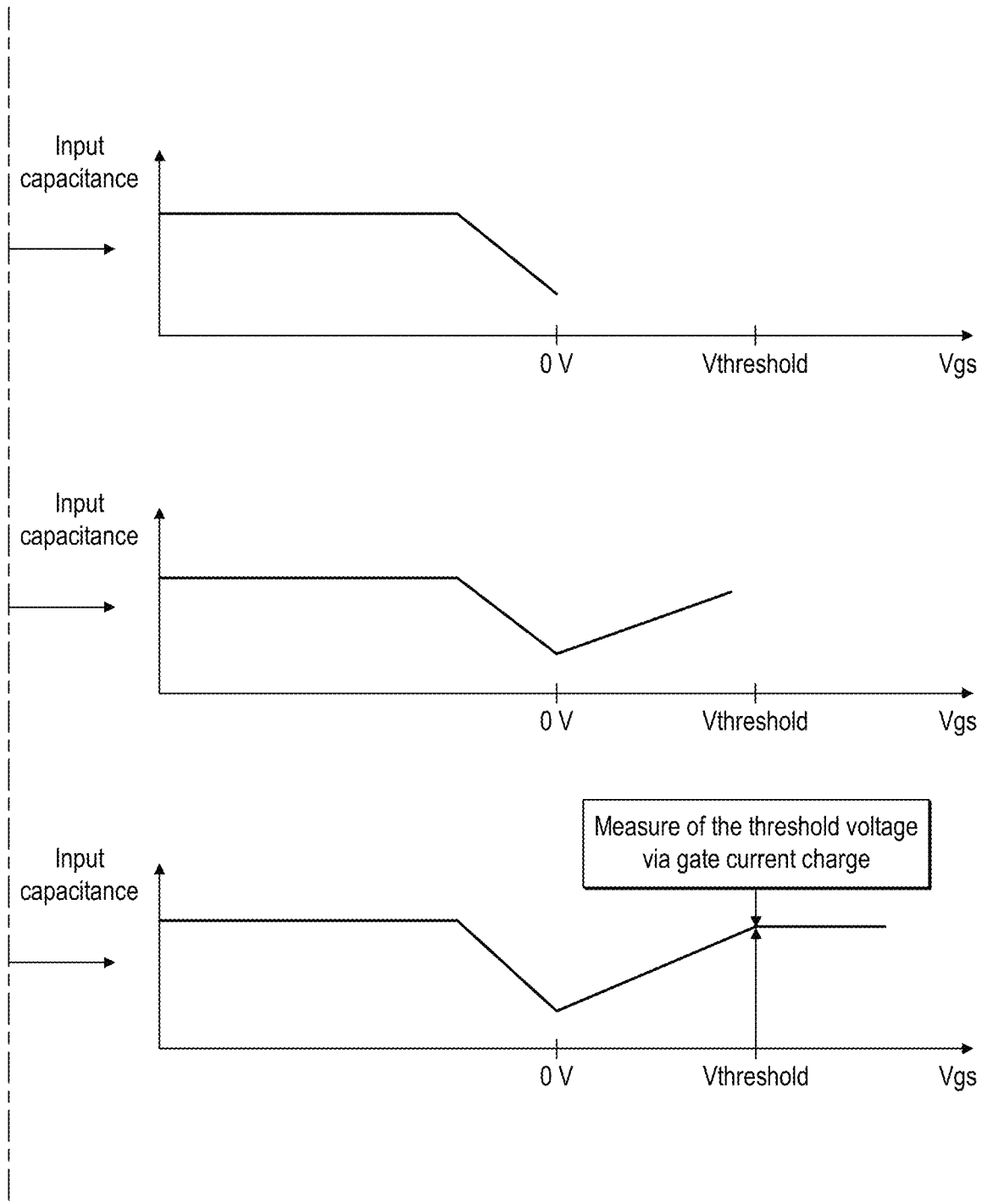

The input capacitance of a MOSFET varies with gate-to-source voltage as shown in FIG. 2. At the threshold voltage $V_{TH}$, there is a discontinuity in the input capacitance and hence the gate current. Using this, the gate current is measured at the input capacitance discontinuity using known measurement calculations, and from this current, the threshold voltage $V_{TH}$ can be derived. More specifically, it is known that the input capacitance of a MOSFET depends on the thickness of the gate oxide, the threshold voltage and other parameters related to the material of the device. The input capacitance depends on the applied voltage and shows a discontinuity when the threshold is reached (see FIG. 2). It is therefore possible to indirectly measure the threshold voltage. For example, a high pass filter can be applied to the gate current to detect when a spike occurs (indicative of the discontinuity) and the gate-to-source voltage at that time, which will be the threshold voltage, can be recorded. This principle is used to determine the time delay.

Figure 1C:
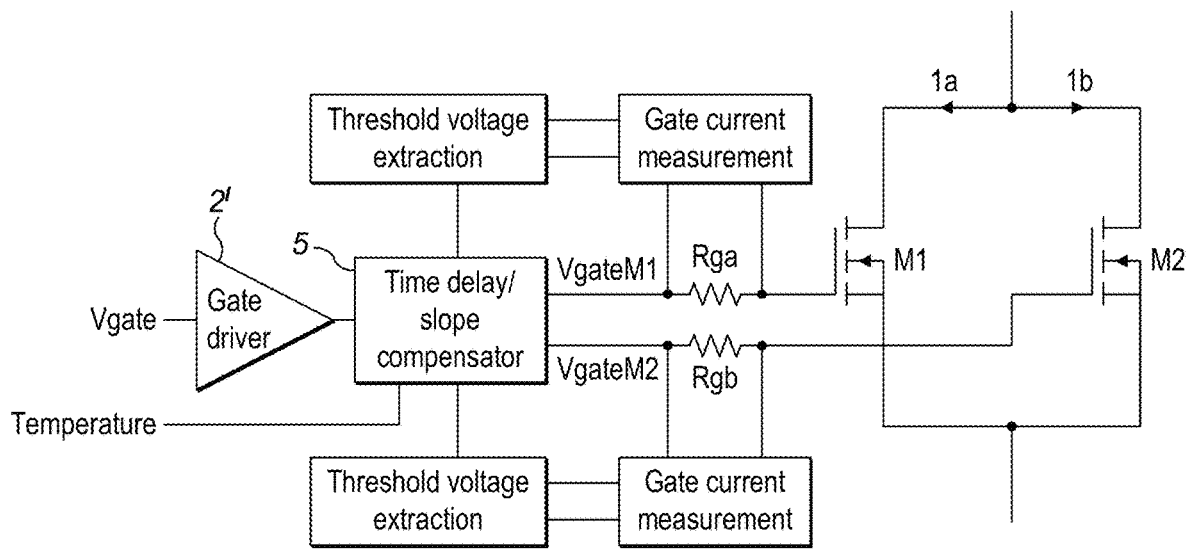
FIG. 1C is a schematic circuit diagram of a power switching circuit modified according to the present disclosure.
Figure 1D:
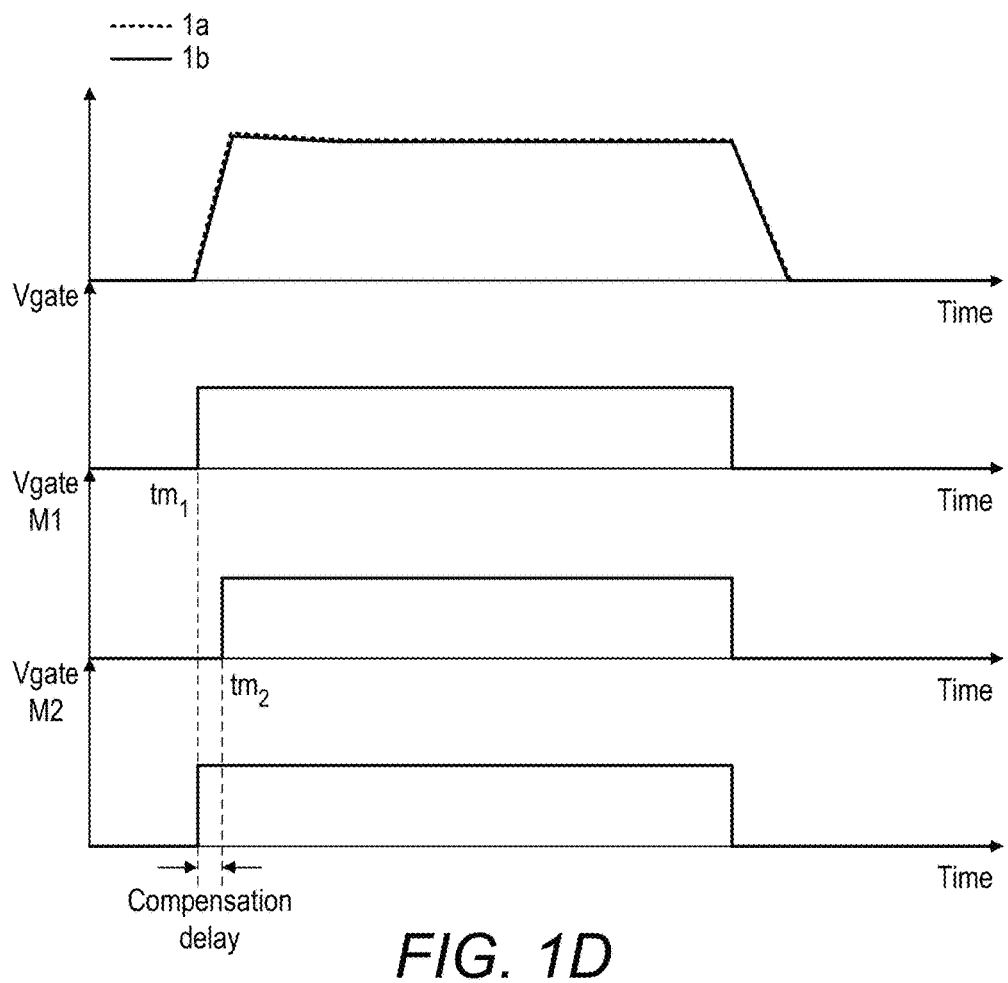
FIG. 1D shows the variation of current through the respective switching devices over time for the arrangement of FIG. 1C.

Operation of the control according to the disclosure will now be described with reference to FIGS. 1C, 1D and FIG. 3.

According to the present disclosure, the self-calibration is performed as follows: On power up, at step 100 of FIG. 3, Vgate is applied to the gate driver 2'. Initially, under the control of a compensator 5, at step 101, all parallel devices except M2 (here M1) are turned ON. Thereafter, M2 is turned on slowly at step 102. This way, the input capacitance of M2 can be extracted since the drain and source are shorted by turning on the MOSFET to be measured. From the gate current, the threshold voltage $V_{TH}$ can be determined as described above at step 103. The measurement is also made for any other switching devices in parallel with M1 (not shown).

Next, all parallel switching devices are switched off (step 104) and M2 and, if more than two switching devices are paralleled, all paralleled switches except M1, are turned ON (step 105). A time thereafter, M1 is slowly turned ON at step 106 so that the threshold voltage for M1 can be determined at step 107 (in the same way as above for M2). Based on the difference between the threshold voltages for the all of the parallel switching devices M1, M2 a time delay or slope is computed at step 108 to compensate for the mismatch in threshold voltages, which is the main cause of current imbalances at switch on, and this is used to control the gate driver to compensate for the current imbalance.

The above example describes driving the gates with a voltage source, but the gates can also be driven by a current source. When driven by a voltage source, the turn-on time instant can be derived from the following equation:

$$t_{Vgs=Vth} = -R * C * \ln\left\{1 - \frac{V_{th}}{V_{gs,max}}\right\}$$

R—Gate resistance
C—input capacitance of the MOSFET
$V_{th}$—Threshold voltage of the MOSFET
$V_{gs,max}$—Maximum input gate source voltage There are different ways to match the turn-on instant of the devices to the threshold voltage i.e. to match $t_{Vgs=Vth}$ of each paralleled MOSFET. One method is creating a time delay a ($t_{delay}$) between the different $t_{Vgs=Vth}$ of each MOSFET to synchronize the turn-on time.

1. R variation: as per the equation above, the synchronization of $t_{Vgs=Vth}$ can be achieved by changing the value of R (this is described in Japanese patent JP2014230307A)
2. C variation: it can also be implemented by adding external voltage controlled capacitance at the input of gate and source of the MOSFET and applying a control-bias voltage on the capacitor which effectively changes the value of C in real-time to synchronize the turn-on times of the MOSFET.
3. $V_{gsmax}$ variation: the turn-on time of paralleled MOSFET can be synchronized by varying the input voltage $V_{gs,max}$ until the turn-on occurs and then keep the value of $V_{gs,max}$ constant for all the paralleled MOSFET.
4. It is also possible to drive the gate source with a current source and the resulting equation for turn-on time at which the threshold voltage on the MOSFET is impressed is given by the equation $$t_{Vgs=Vth} = \frac{C * V_{th}}{I_g}$$

C—input capacitance of the MOSFET
$V_{th}$—Threshold voltage of the MOSFET
$I_g$—Charging current to the input capacitance It is simple to compensate the threshold voltage mismatch and synchronize the turn-on time of the paralleled MOSFET by controlling the charge injected into the capacitance C by controlling the input current $I_g$ for each MOSFET.

There are multiple ways to implement a controlled current source where the control variable here can be chosen as the compensation of the threshold voltage.

The invention claimed is:
1. A method of controlling a power converter having a plurality of parallel-connected switching devices, the method comprising:
    measuring a threshold voltage of each of the parallel-connected switching devices at start up of the power converter in an initial self-calibration process;
    measuring a gate current of each of the parallel-connected switching devices at start up of the power converter in the initial self-calibration process;
    extracting the threshold voltage of each switching device as its gate-to-source voltage at a time when a spike of the gate current occurs, indicating a discontinuity in an input capacitance of the respective switching device; and determining synchronization of the times when the spikes of gate current of the respective switching devices occurred.

2. The method of claim 1, wherein the initial self-calibration process comprises, on start up of the power converter:
   i) turning on all parallel-connected switching devices except one of said switching devices;
   ii) thereafter, gradually turning said one switching device on; and
   iii) extracting the threshold voltage of said one switching device; and
   iv) repeating steps i) to iii) for each of the parallel-connected switching devices as said one switching device; and wherein the synchronization is determined from differences in the extracted threshold voltages.

3. The method of claim 2, wherein the synchronization is determined from the following equation:

$$t_{Vgs=Vth} = -R*C*\ln\left\{1 - \frac{V_{th}}{V_{gs,max}}\right\}$$

R—Gate resistance
C—input capacitance of the one switching device
$V_{th}$—Threshold voltage of the one switching device
$V_{gs,max}$—Maximum input gate source voltage.

4. The method of claim 3, wherein the synchronized turn-on time is determined by varying C by adding external voltage controlled capacitance at the input of the respective switching device and applying a control-bias voltage on the one switching device to effectively change the value of C in real-time to synchronize the turn-on time of the switching device.

5. A system for controlling a power converter having a plurality of parallel-connected switching devices, the system comprising:
   means for measuring a threshold voltage of each of the parallel connected switching devices at start up of the power converter in an initial self-calibration process;
   means for measuring a gate current of each of the parallel connected switching devices at start up of the power converter in the initial self-calibration process;
   means for extracting a threshold voltage of each switching device as its gate-to-source voltage at a time when a spike of the gate current occurs, indicating a discontinuity in an input capacitance of the respective switching device; and
   means for synchronizing the times at which the threshold voltages of the respective switching devices are extracted.

6. A method of controlling a power converter having a plurality of parallel-connected switching devices, the method comprising:
   measuring a threshold voltage of each of the parallel-connected switching devices at start up of the power converter in an initial self-calibration process; and
   determining synchronization of the times when spikes of gate current of the respective switching devices occurred;
   wherein the initial self-calibration process comprises, on start up of the power converter:
   i) turning on all parallel-connected switching devices except one of said switching devices;
   ii) thereafter, gradually turning said one switching device on; and
   iii) extracting the threshold voltage of said one switching device; and
   iv) repeating steps i) to iii) for each of the parallel-connected switching devices as said one switching device; and wherein the synchronization is determined from differences in the extracted threshold voltages.

7. The method of claim 6, wherein the synchronization is determined from the following equation:

$$t_{Vgs=Vth} = -R*C*\ln\left\{1 - \frac{V_{th}}{V_{gs,max}}\right\}$$

R—Gate resistance
C—input capacitance of the one switching device
$V_{th}$—Threshold voltage of the one switching device
$V_{gs,max}$—Maximum input gate source voltage.

8. The method of claim 7, wherein the synchronization is determined by varying C by adding external voltage controlled capacitance at the input of the respective switching device and applying a control-bias voltage on the respective switching.

* * * * *